(12) United States Patent
Sano et al.

(10) Patent No.: US 6,625,031 B2
(45) Date of Patent: Sep. 23, 2003

(54) MODULE PART AND ELECTRONIC DEVICE

(75) Inventors: Naoto Sano, Otsu (JP); Yasuyuki Morishima, Kyotanabe (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/984,679

(22) Filed: Oct. 16, 2001

(65) Prior Publication Data

US 2002/0075658 A1 Jun. 20, 2002

(30) Foreign Application Priority Data

Oct. 26, 2000 (JP) ........................................ 2000-327084

(51) Int. Cl.$^7$ ................................................. H05K 1/14
(52) U.S. Cl. ........................ 361/737; 361/728; 361/736; 361/784; 361/790; 361/807
(58) Field of Search ................................. 361/728, 736, 361/737, 784, 790, 803, 807–811

(56) References Cited

U.S. PATENT DOCUMENTS

| | | | | |
|---|---|---|---|---|
| 4,413,308 A | * | 11/1983 | Brown | 361/749 |
| 4,544,989 A | * | 10/1985 | Nakabu et al. | 361/764 |
| 5,208,450 A | * | 5/1993 | Uenishi et al. | 235/492 |
| 5,264,990 A | * | 11/1993 | Venambre | 361/761 |
| 5,299,096 A | * | 3/1994 | Ishimatsu | 361/807 |
| 5,994,648 A | * | 11/1999 | Glovatsky et al. | 174/260 |
| 6,031,726 A | * | 2/2000 | Vinciarelli et al. | 361/761 |
| 6,466,454 B1 | * | 10/2002 | Jitaru | 361/836 |

* cited by examiner

Primary Examiner—Jayprakash N. Gandhi
(74) Attorney, Agent, or Firm—Keating & Bennett, LLP

(57) ABSTRACT

A part having a large height contained in a module part is placed in a first cut-off portion formed in a part-mounting substrate to be mounted. Moreover, the module part itself is placed in a second cut-off portion formed in a mother board to be mounted.

4 Claims, 4 Drawing Sheets

MODULE PART AND ELECTRONIC DEVICE

BACKGROUND OF THE INVENTION

1. Field of the Invention

The present invention relates to a module part and an electronic device having the mounting structure, and more particularly, to a module part such as a DC—DC converter to be mounted, e.g., onto a notebook-sized personal computer and electronic devices containing the module parts

2. Description of the Related Art

FIG. 5 is a cross sectional view of a conventional module part and a mounting structure of the module part. In FIG. 5, a module part 1 comprises a part-mounting substrate 2, connecting terminals 3 provided on one main face of the part-mounting substrate 2, and parts 4, 5, and 6 mounted on the other main face of the part-mounting substrate 2.

The part 4 has a larger height than any other part, and is provided with connecting terminals 4a. The connecting terminals 4a are soldered to wiring electrodes (not shown) formed on the other main face of the part-mounting substrate 2. As regards the parts 5 and 6, connecting electrodes are formed, for example, on the back sides thereof, and are soldered to wiring electrodes similarly to the part 4. The connecting terminals 3 provided on the one main face of the part-mounting substrate 2 are connected to the wiring electrodes formed on the other main face of the substrate 2.

The connecting terminals 3 are soldered onto the wiring electrodes (not shown) formed on one main face of the mother board 7, so that the module part 1 configured as described above is mounted onto the mother board 7.

FIG. 6 shows a cross sectional view of another conventional module part. In FIG. 6, the same or equivalent parts to those shown in FIG. 5 are designated by the same reference numerals, and the repeated description is omitted.

In FIG. 6, a module part 10 contains a part 12, which also has a large height, instead of the part 4 of the module part 1 shown in FIG. 5. Connecting terminals 12a are provided for the part 12. Moreover, the module part 10 contains a part-mounting substrate 11 having a first cutoff portion 11a with such a size that the part 12 can be placed therein, instead of the part-mounting substrate 2. The part 12 is placed in the first cut-off portion (hole) 1a of the part-mounting substrate 11 to be mounted. The connecting terminals 12a are soldered onto wiring electrodes (not shown) formed on the other main face of the part-mounting substrate 11.

The connecting terminals 3 are provided on the part-mounting substrate 11 similarly to the part-mounting substrate 2 shown in FIG. 5. The connecting terminals 3 are soldered onto wiring electrodes (not shown) formed on the one main face of the mother board 7, so that the module part 10 is mounted onto the mother board 7.

FIG. 7 is a cross sectional view of yet another conventional module part. In FIG. 7 the same or equivalent parts to those shown in FIG. 5 are designated by the same reference numerals, and the repeated description is omitted.

A module part 20 of FIG. 7 is provided with connecting terminals 21 formed on the other main face of the part-mounting substrate 2, instead of the connecting terminals 3 of the module part 1 shown in FIG. 5. The connection surface of each connecting terminal 21 in the height direction of each module part 20 is just level with the bottom of the part 4 in the height direction thereof. Here, the connection surface of the connecting terminal 21 means the surface thereof which is connected to the wiring electrode (not shown) formed on the mother substrate 22.

The part-mounting substrate 2 of the module part 20 configured as described above is placed into a second cutoff portion (hole) 22a formed in a mother board 22, the second cut-off portion 22a having such a size that the part-mounting substrate 2 can be placed therein. In this case, the connecting terminals 21 are soldered onto wiring electrodes (not shown) formed on the one main face of the mother substrate 22.

Referring to the module part 1 shown in FIG. 5, the part 4 having a large height is mounted onto the part-mounting substrate 2. Thus, the module part 1 itself becomes very high. Accordingly, problematically, when the module part 1 is mounted onto the mother board 7, the whole of a circuit portion containing the module part 1 and the mother board 7 becomes thick, which prevents reduction in the thickness of an electronic device using the mother board 7.

The part 12 of the module part 10 shown in FIG. 6 is placed in the cutting-off portion 11a of the part-mounting substrate 11 to be mounted. Accordingly, the height of the module part 10 itself is reduced by the thickness of the part-mounting substrate 11 compared to that of the module part 1 shown in FIG. 5. Thus, the thickness of the whole of a circuit portion containing the module part 10 and the mother board 7 is decreased by the thickness of the part-mounting substrate 11. However, the decrease in thickness is insufficient. A problem arises in that the thickness of an electronic device using the mother board 7 can be satisfactorily reduced.

Moreover, the height of the module part 20 itself shown in FIG. 7 is not different from that of the module part 1 shown in FIG. 5. Since the module part 20 has such a structure as to be placed in the second cut-off portion 22a of the mother board 22 to be mounted, the thickness of the whole of a circuit portion containing the module part 20 and the mother board 22, obtained after the module part 20 is mounted, is decreased by the thickness of the mother board 22 itself. However, problematically, the decrease in thickness is insufficient. Thus, reduction in the thickness of an electronic device using the mother board 22 can not be satisfactorily performed.

SUMMARY OF THE INVENTION

Accordingly, it is an object of the present invention to provide a module part of which the height can be decreased and which serves to reduce the overall thickness of a circuit portion containing the module part and a mother board, obtained after the module part is mounted, and an electronic device using the module part with the above-described problems being solved.

The module part or the present invention comprises: a part-mounting substrate having a first cut-off portion: a part having a large height and mounted to the part-mounting substrate such that at least portion of the part is placed in the first cut-off portion; and a mother board having a second cut-off portion and mounting thereon the part-mounting substrate such that at least a portion of part-mounting substrate is placed in the second cut-off portion.

According to the another aspect of the present invention, the module part comprises: a part-mounting substrate having a first cut-off portion: a part having a large height and mounted to the part-mounting substrate such that at least portion of the part is placed in the first cut-off portion; and a mother board having a second cut-off portion and mounting thereon the part-mounting substrate such that at least a portion of the part is placed in the second cut-off portion.

According to the present invention, the module part contains the part-mounting substrate having the first cutoff portion and the part having a large height placed in the first cut-off portion to be mounted, and the part-mounting substrate has such a structure as to be placed in the second cut-off portion of the mother board, and in the mounting structure of the module part, the part-mounting substrate is placed in the second cut-off portion to be mounted. Thus, the thickness of the whole of a circuit portion containing the module part and the mother board can be reduced.

Alternatively, the module part contains the part-mounting substrate having the first cut-off portion and the part having a large height placed in the first cut-off portion to be mounted, the part having a large height having such a structure as to be placed in the second cutoff portion of the mother board to be mounted, and in the mounting structure of the module part, the part having a large height is placed in the second cut-off portion of the mother board. Thus, the thickness of the whole of a circuit portion containing the module part and the mother board can be reduced.

The electronic device in accordance with the present invention, which uses the module part or the mounting structure of the module part in accordance with the present invention, can be reduced in thickness.

DESCRIPTION OF THE PREFERRED EMBODIMENTS

Figure 1:
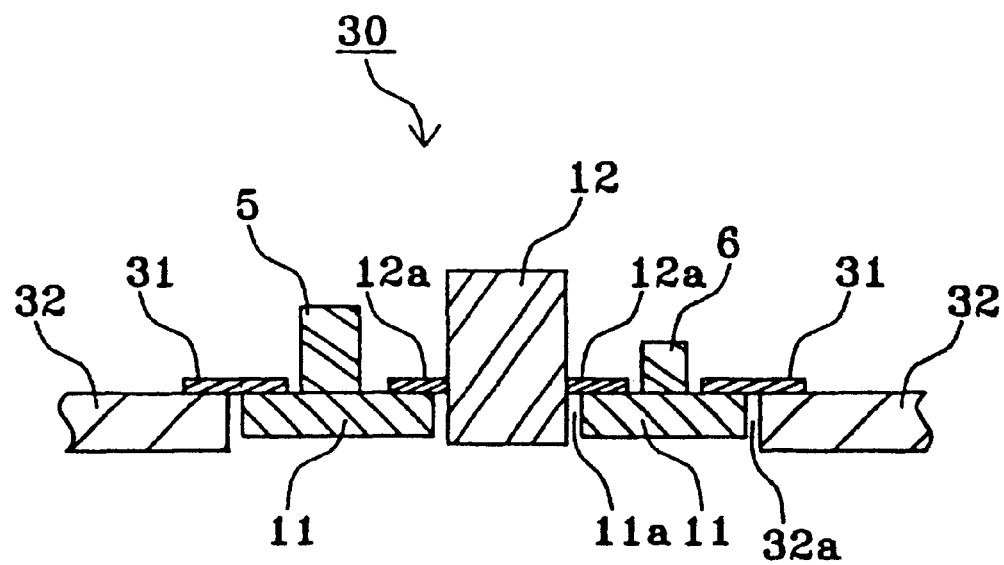
FIG. 1 is a cross sectional view of a module part and a mounting structure of the module part according to an embodiment of the present invention.
Figure 6:
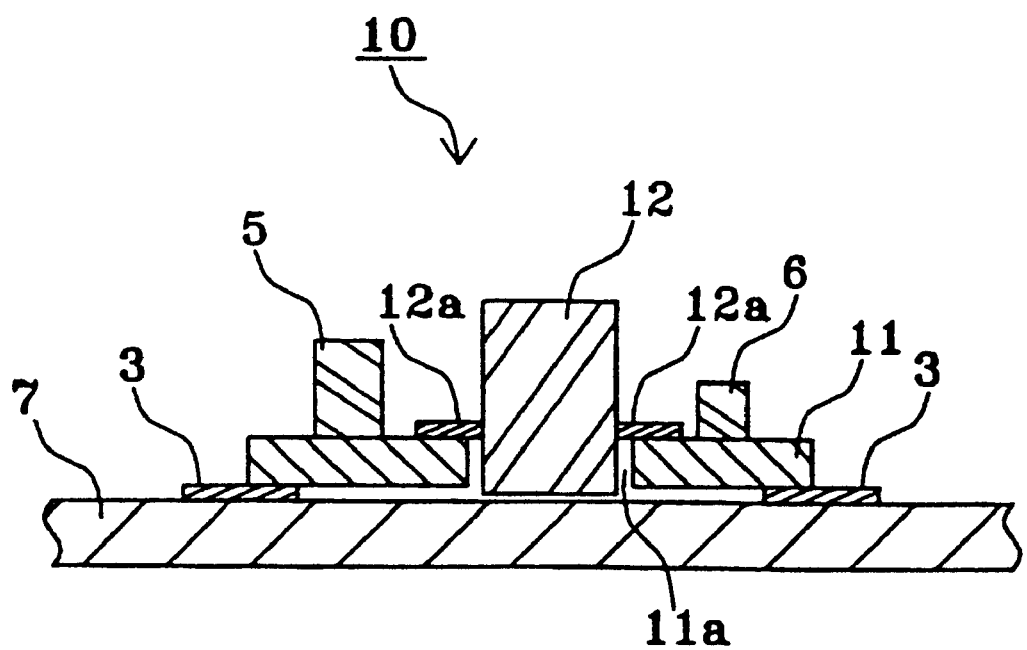
FIG. 6 is a cross sectional view of another conventional module part and a mounting structure thereof.

FIG. 1 is a cross sectional view of a module part and a mounting structure of the module part according to an embodiment of the present invention. In FIG. 1, the same or equivalent parts to those shown in FIG. 6 are designated by the same reference numerals. The repeated description is omitted.

A module part 30 shown in FIG. 1 is provided with connecting terminals 31 on the other main face of the part-mounting substrate 11, instead of the connecting terminals 3 of the module part 10 shown in FIG. 6. The connection surface of each connecting terminal 31 in the height direction of the module part 30 is just level with a position in the middle of the part 12 in the height direction thereof. Here, the connection surface of the connecting terminal 31 means the surface thereof connected to the wiring electrode (not shown) formed on one main surface of the mother substrate 32.

The part-mounting substrate 11 is placed in a second cut-off portion (hole) 32a formed in a mother board 32, the second cut-off portion 32a having such a size that the part-mounting substrate 11 of the module part 30 can be placed therein, so that the module part 30 configured as described above is mounted to the mother board 32. Then, the connection surface of each connecting terminal 31 is soldered onto wiring electrodes (not shown) formed on the one main face of the mother board 32.

That is, the part 12 of the module part 30 is placed in the first cutting-off portion 11a formed in the part-mounting substrate 11 to be mounted, and moreover, the module part 30 itself is placed in the second cut-off portion 32a of the mother board 32 to be mounted thereto.

Figure 5:
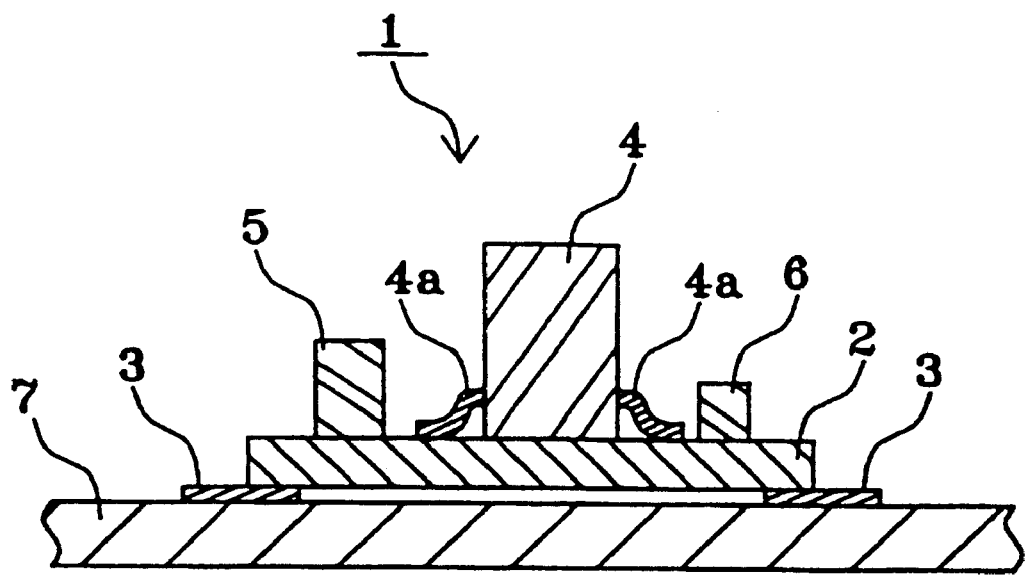
FIG. 5 is a cross sectional view of a conventional module part and a mounting structure thereof.
Figure 7:
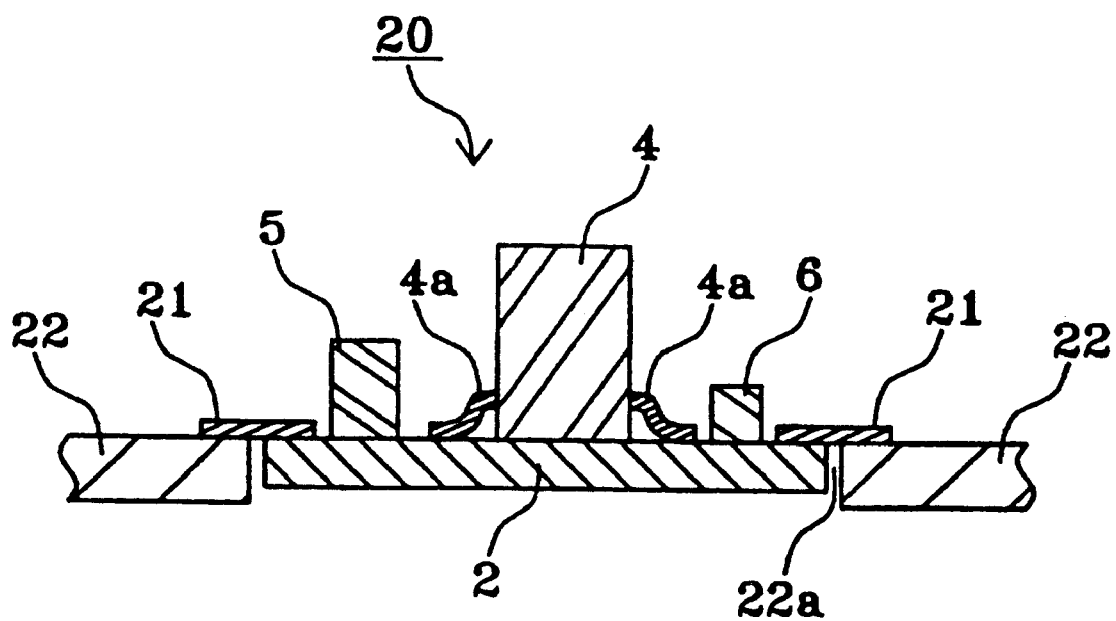
FIG. 7 is a cross sectional view of yet another conventional module part and a mounting structure thereof.

Since the part 12 of the module part 30 configured as described above is placed in the first cut-off portion 11a to be mounted, the height of the module part 30 itself can be decreased by the thickness of the part-mounting substrate 11. Moreover, since the module part 30 has a structure in which the module part 30 itself can be placed in the second cut-off portion 32a of the mother board 32 to be mounted, the thickness of the whole of a circuit portion containing the module part 30 and the mother board 32, obtained after the module part 30 is mounted, can be decreased by the thickness of the mother board 32 itself. That is, when the module part 30 is mounted to the mother board 32, the thickness of the whole of the circuit portion obtained after the module part is mounted can be decreased by not more than the sum of the thickness of the part-mounting substrate 11 and the thickness of the module part 32, compared to the thickness of the module part 1 shown in FIG. 5, for example. Moreover, the thickness of the whole of the circuit portion can be decreased by not more than the thickness of the mother board 32, compared to the case of the module part 10 shown in FIG. 6, and moreover, can be reduced by not more than the thickness of the part-mounting substrate 11, compared with the case of the module part 20 shown in FIG. 7.

Figure 2:
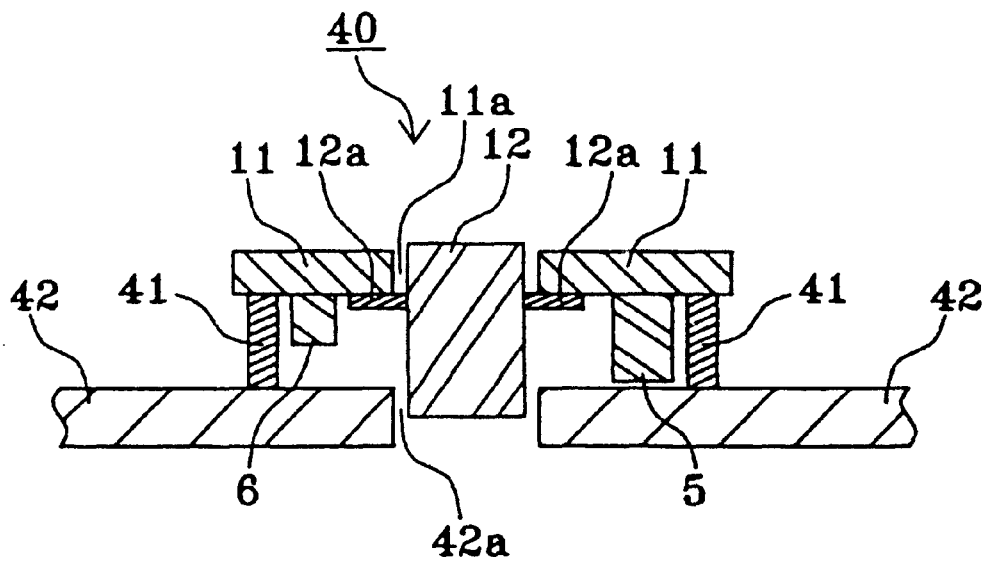
FIG. 2 is a cross sectional view of a module part and a mounting structure of the module part according to another embodiment of the present invention.

FIG. 2 is a cross sectional view of a module part according to another embodiment of the present invention. In FIG. 2, the same or equivalent parts to those in FIG. 1 are designated by the same reference numerals, and the repeated description is omitted.

A module part 40 shown in FIG. 2 is provided with connecting terminals 41 having a predetermined height and formed on the other main face of the part-mounting substrate 11, instead of the connecting terminals 31 of the module part 30 shown in FIG. 1. The predetermined height of each connecting terminal 41 means a height which is set to be larger than that of each of the parts 5 and 6 and to be smaller by not more than the thickness of the mother board 42 than the thickness of the part 12. Accordingly, the connection surface of each connecting terminal 41 in the height direction of the module part 40 is just level with a position in the middle of the part 12 in the height direction thereof.

The module part 40 configured as described above is turned bottom up, and the top portion of the part 12 is placed in a second cut-off portion 42a of the mother board 42, the portion 42a having such a size that the part 12 can be placed therein, whereby the module part 40 is mounted to the mother board 42. In this case, the connection surface of each connecting terminal 41 is soldered onto a wiring electrode (not shown) formed on one main face of the mother board 42.

That is, the part 12 of the module part 40 is placed in the first cut-off portion 11a formed in the part-mounting substrate 11 to be mounted, and moreover, the part 12, that is, the projecting portion of the module part 40 has such a structure as to be placed in the second cut-off portion 42a formed in the mother board 42 for mounting.

When the module part 40 configured as described above is mounted onto the mother board 42, the thickness of the whole of a circuit portion obtained after the module part 10 is mounted can be decreased by not more than the sum of the thickness of the part-mounting substrate 11 and the thickness of the mother board 42, similarly to the case of the module part 30 shown in FIG. 1.

Figure 3:
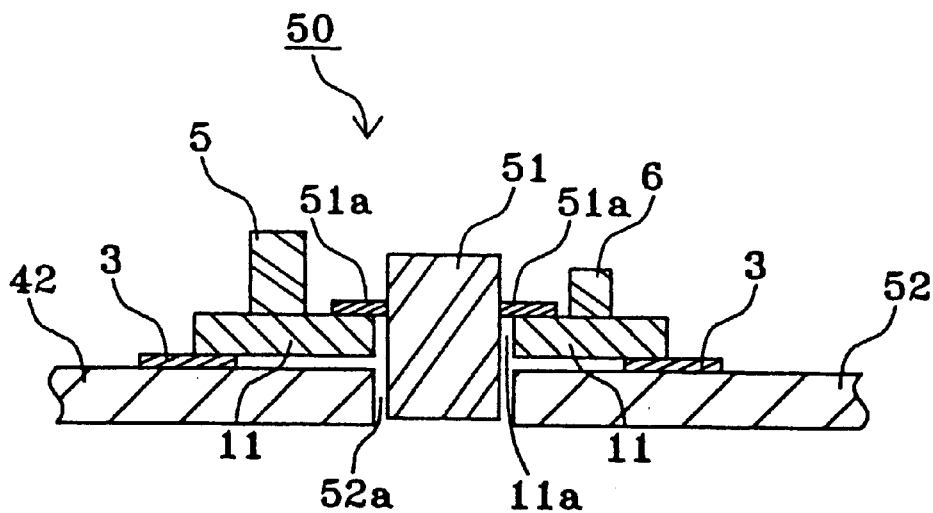
FIG. 3 is a cross sectional view of a module part and a mounting structure of the module part according to yet another embodiment of the present invention.

FIG. 3 shows a module part according to yet another embodiment of the present invention. In FIG. 3, the same or equivalent parts to those shown in FIG. 6 are designated by the same reference numerals, and the repeated description is omitted.

In FIG. 3, a module part 50 contains a part 51 instead of the part 12 of the module part 10 shown in FIG. 6. The part 51 has connecting terminals 51*a*. The position of each connecting terminal 51*a* is set to be higher than that of each connecting terminal 12*a* of the part 12. Therefore, when the part 51 is mounted to the part-mounting substrate 11, the bottom portion of the part 51 is projected from the one main surface of the part-mounting substrate 11 by a predetermined height. Here, the predetermined height is not more than the thickness of the mother board 52 which will be described below. Therefore, the connection surface of each connecting terminal 3 in the height direction of the module part 50 is just level with a position in the middle of the part 51 in the height direction thereof.

The bottom portion of the part 51 is placed in a second cut-off portion 52*a* formed in the mother board 52, the second cut-off portion (hole) 52*a* having such a size that the bottom portion of the part 51 can be placed therein, so that the module part 50 is mounted to the mother board 52. The bottom portion of the part 51 is not projected from the other main face of the mother board 52. The connection surface of each connecting terminal 3 is soldered onto a wiring electrode (not shown) formed on the one main surface of the mother board 52.

That is, in the module part 50, the part 51 is placed in the first cut-off portion 11*a* of the part-mounting substrate 11, and moreover, the bottom portion of the part 51 projecting from the one main surface of the part-mounting substrate 11, namely, the projection portion of the module part 50 is placed into the second cut-off portion 52*a* of the mother board 52, so that the module part 50 is mounted to the mother board 52.

When the module part 50 configured as described above is mounted to the mother board 52, the thickness of a circuit portion obtained after the module part 50 is mounted can be reduced by not more than the sum of the thickness of the part-mounting substrate 11 and the thickness of the mother board 52, similarly to the module part 30 shown in FIG. 1.

In each of the above-described embodiments, the part-mounting substrate having one first cutting-off portion is described. The part-mounting substrate may have plural first cutting-off portions, and present the same operation and effects as the substrate having one first cutting-off portion.

Figure 4:
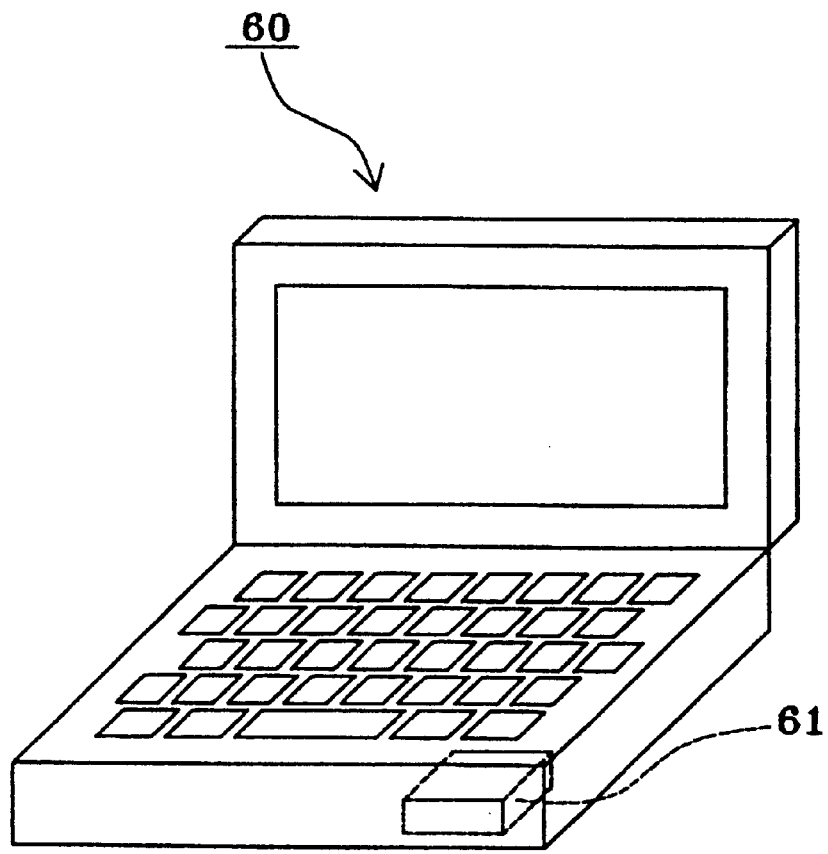
FIG. 4 is a perspective view of an electronic device according to an embodiment of the present invention.

FIG. 4 is a perspective view of an electronic device according to an embodiment of the present invention. In FIG. 4, a notebook-sized personal computer 60 is provided with a switching electric power source device 61 as a power source circuit which is the module part in accordance with the present invention. The switching power source device 61 contains a transformer or a coil (not shown) as a part having a very height, which is placed in a cut-off portion (not shown) provided in the part-mounting substrate (not shown) of the switching power source device 61 to be mounted thereto. The switching power source device 61 is placed in a cut-off portion formed in the mother board (not shown) of the notebook-sized personal computer to be mounted thereto.

Since the notebook-sized personal computer 60 configured as described above uses the switching power source device 61 which is the module part in accordance with the present invention, the thickness of the whole of a circuit part containing the switching power source device 61 and the mother board can be reduced. As a result, the notebook-sized personal computer 60 itself can be reduced in thickness.

The electronic device in accordance with the present invention is not limited to the notebook-sized personal computer, and includes any type of electronic device of which the reduction in thickness is required.

What is claimed is:

1. A module part comprising:
   a part-mounting substrate having a first cut-off portion;
   a part having a large height and mounted to the part-mounting substrate such that at least a portion of the part is placed in the first cut-off portion; and
   a mother board having second cut-off portion and mounting thereon the part-mounting substrate such that at least a portion of the part-mounting substrate is placed in the second cut-off portion.

2. A module part comprising:
   a part-mounting substrate having a first cut-off portion;
   a part having a large height and mounted to the part-mounting substrate such that at least a portion of the part is placed in the first cut-off portion; and
   a mother board having second cut-off portion and mounting thereon the part-mounting substrate such that at least a portion of the part is placed in the second cut-off portion.

3. An electronic device using the module part as defined in claim 1.

4. An electronic device using the module part as defined in claim 2.

* * * * *